US007023267B2

(12) United States Patent
Lee et al.

(10) Patent No.: US 7,023,267 B2
(45) Date of Patent: Apr. 4, 2006

(54) SWITCHING POWER AMPLIFIER USING A FREQUENCY TRANSLATING DELTA SIGMA MODULATOR

(75) Inventors: Wai Lee, Austin, TX (US); Shawn Stapleton, Austin, TX (US); Kelly Mekechuk, Austin, TX (US)

(73) Assignee: Prophesi Technologies, Inc., Austin, TX (US)

( * ) Notice: Subject to any disclaimer, the term of this patent is extended or adjusted under 35 U.S.C. 154(b) by 82 days.

(21) Appl. No.: 10/780,188

(22) Filed: Feb. 17, 2004

(65) Prior Publication Data

US 2005/0179487 A1 Aug. 18, 2005

(51) Int. Cl.
*H03F 3/38* (2006.01)

(52) U.S. Cl. ........................ 330/10; 330/101; 330/251; 330/260; 455/91

(58) Field of Classification Search .................. 330/10, 330/101, 251; 375/247, 295, 316, 32; 455/3.02, 455/91
See application file for complete search history.

(56) References Cited

U.S. PATENT DOCUMENTS 4,843,339 A 6/1989 Burt et al.
5,352,986 A 10/1994 Modgil et al.
5,734,683 A * 3/1998 Hulkko et al. .............. 375/316
5,777,512 A 7/1998 Tripathi et al.
5,909,153 A * 6/1999 Delano et al. .............. 332/107
5,953,636 A * 9/1999 Keate et al. ............... 455/3.02
5,974,089 A 10/1999 Tripathi et al.
6,060,950 A * 5/2000 Groe .......................... 330/279
6,191,653 B1 2/2001 Camp, Jr. et al.
6,275,540 B1 * 8/2001 Barrett et al. ............... 375/316
6,373,334 B1 4/2002 Melanson
6,414,560 B1 * 7/2002 Delano ....................... 332/107
6,560,447 B1 * 5/2003 Rahman et al. .......... 455/232.1
6,577,189 B1 6/2003 Jayaraman et al.
6,597,748 B1 * 7/2003 Hietala et al. .............. 375/324
6,630,899 B1 10/2003 Jayaraman
6,678,340 B1 * 1/2004 Khlat et al. ................. 375/350
6,759,899 B1 * 7/2004 Lennartson et al. .......... 330/10
6,794,930 B1 * 9/2004 Nurminen .................... 330/10
2003/0100286 A1 * 5/2003 Severson et al. ........... 455/324
2003/0210746 A1 * 11/2003 Asbeck et al. .............. 375/247

OTHER PUBLICATIONS

Maurice Bellanger, Sabrina Azrouf, Vincent Bruneau; "A Bandpass Subsampled Delta-Sigma Modulator for Narrowband Cellular Mobile Communications"; pp. 353-356, published date is unknown.
Walter J. Chudobiak and Donald F. Page; "Frequency and Power Limiations of Class-D Transistor Amplifiers", IEEE Journal, vol. sc 4, No. 1, Feb. 1969 pp. 25-37.

(Continued)

*Primary Examiner*—Peguy JeanPierre
*Assistant Examiner*—Khai M. Nguyen
(74) *Attorney, Agent, or Firm*—Charles W. Bethards

(57) ABSTRACT

A radio frequency (RF) switching power amplifier comprises: a switching amplifier 203 to provide an amplified signal within an RF band; and a delta signal modulator (DSM) 207 that is operable; to control the switching amplifier in a feedback configuration, to process an input signal within an intermediate frequency (IF) band where the input signal corresponds to a base band signal and the amplified signal, and to provide an output signal within the RF band to drive the switching amplifier. Certain embodiments allow for or compensate for a floating or variable IF band and multiple RF bands.

40 Claims, 5 Drawing Sheets

OTHER PUBLICATIONS

Arun Jayaraman, et al.; "A Linear High-Efficiency Microwave Power Amplifiers Using Bandpass Delta-Sigma Modulators", IEEE, vol. 8, No. 3, Mar. 1998, pp. 121-123.

J. Keyzer, et al., "Digital Generation of RF Signals for Wireless Communications With Band-Pass Delta-Sigma Modulation", 2001 IEEE MTT-S Digest pp. 2127-2130, no month.

R. Schreier and M. Snelgrove, "Bandpass Sigma-Delta Modulation", Electronic Letters, Nov. 9, 1989, vol. 25. No. 23, pp. 1560-1561.

H. Balan, M. Declercq, "12v Class-D Amplifier in 5V CMOS Technology", 1995 IEEE Cusom Intregrated Circuits Conference, pp. 559-562, no month.

Enrico Dallago and Gabriele Sassone, "Single-Cycle Quasi-Resonant Converters as Sigma-Delta Audio Power Stages", 1996 IEEE, pp. 645-650, no month.

M.A.E. Andersen, "A New Application for Zero-Current-Switched Full-Wave Resonant Converters", 1993 The European Power Electronics Association, pp. 83-86, no month.

Ion E. Opris and Gregory T. A. Kovacs, "A Video bandwidth Analog Median Circuit", IEEE 1995 Custom Integrated Circuits Conference pp. 555-558, no month.

Glen Luckjiff, et al., "Interpolative Sigma Delta Modulators for High Frequency Power Electronic Applications", 1995 IEEE, pp. 444-449, mo month.

* cited by examiner

SWITCHING POWER AMPLIFIER USING A FREQUENCY TRANSLATING DELTA SIGMA MODULATOR

FIELD OF THE INVENTION

The present invention relates in general to power amplifiers and more specifically to switching power amplifiers using a frequency translating delta sigma modulator.

BACKGROUND OF THE INVENTION

Power amplifiers including switching power amplifiers are known. One figure of merit for power amplifiers is efficiency. Switching power amplifiers have been demonstrated that have excellent efficiency at audio frequencies.

However, most communication standards now specify some form of complex modulation (e.g. combination of phase and amplitude modulation) and often multiple signals or carriers. The net result of these carriers with complex modulation is a signal that may have a large dynamic range, such as 6–15 dB or more for a peak to average ratio. These communication standards often define systems intended to operate in the low GHz frequency bands with a large bandwidth, for example, 2.1 GHz with a 20 MHz bandwidth for wide band code division multiple access systems. Base station transmitters can have peak power requirements on the order of 250 watts.

Practitioners have resorted to class A or AB power amplifiers to implement radio frequency amplifiers that will satisfy the linearity and dynamic range requirements noted above. These A or AB amplifiers may have efficiencies on the order of 10%, e.g. 10 watts are consumed in order to provide 1 watt of output power. More recently switching power amplifiers that operate at high frequencies, such as radio frequencies have been considered in order to improve the efficiency for such amplifiers.

Various proposals have been advanced that utilize a delta sigma modulator (DSM) to provide the switching signal to drive the switching amplifier stages, however these approaches have their respective problems. For example, the DSM must be clocked at twice the radio frequency to meet the Nyquist criteria and in practice this is usually 4 or 8 times the radio frequency. It may be difficult or impractical to implement appropriate DSMs (devices and resonators) at these clock rates.

One approach that has been used for linear power amplifier stages where gain and phase characteristics are controlled is up-converting an intermediate frequency signal to a radio frequency, amplifying the radio frequency signal and down converting the amplified signal to form a feedback signal. This places the power amplifier inside a control loop where imperfections with the amplifier can be controlled or compensated. However due to loop stability issues this approach does not work for switching amplifiers where gains and phases are not well known.

Therefore, a need exists for an improved efficiency power amplifier, suitable for use at radio frequencies.

BRIEF DESCRIPTION OF THE DRAWINGS

The accompanying figures where like reference numerals refer to identical or functionally similar elements and which together with the detailed description below are incorporated in and form part of the specification, serve to further illustrate a preferred embodiment and to explain various principles and advantages in accordance with the present invention.

DETAILED DESCRIPTION OF THE PREFERRED EMBODIMENTS

Figure 1:
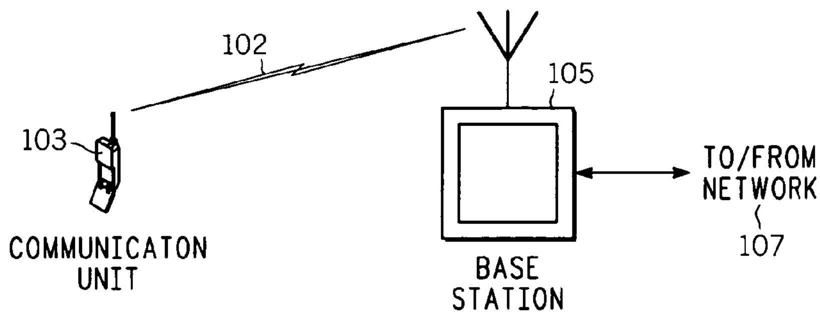
FIG. 1 depicts, in a simplified and representative form, an exemplary system diagram suitable for using switching power amplifiers.

In overview, the present disclosure concerns communication equipment, including transmitters, such as used in communication base stations or communication units. Such transmitters more specifically include switching power amplifiers. Such amplifiers for example, may be found in cellular, two-way, and the like radio networks or systems in the form of fixed or stationary and mobile equipment. The fixed equipment is often referred to as base stations or transmitters and the mobile equipment can be referred to as communication units, devices, handsets or mobile stations. Such systems and equipment are normally used to support and provide services such as voice and data communication services to or for such communication units or users thereof.

More particularly various inventive concepts and principles are embodied in systems or constituent elements, communication units, transmitters and methods therein for providing or facilitating a switching power amplifier with dramatic improvements in efficiency and thus size and operational costs. These improvements are associated for example with power supplies and heat management issues. The switching power amplifier advantageously use a delta sigma modulator that performs frequency translation thereby advantageously yielding a practical and readily producible power amplifier provided such amplifiers are arranged and constructed in accordance with the concepts and principles discussed and disclosed herein.

The communication systems and communication transmitters that are of particular interest are those that may provide or facilitate voice communication services or data or messaging services over wide area networks (WANs), such as conventional two way systems and devices, various cellular phone systems including but not limited to, CDMA (code division multiple access) and variants thereof, GSM, GPRS (General Packet Radio System), 2.5G and 3G systems such as UMTS (Universal Mobile Telecommunication Service) systems, 4G OFDM (Orthogonal Frequency Division Multiplexed) systems and variants or evolutions thereof. Furthermore the wireless communication units or devices of interest may have, typically short range wireless communication capability normally referred to as WLAN capabilities, such as IEEE 802.xx (802.11a,b,g, 802.15.x, etc.), Bluetooth, HiperLan and the like that preferably utilize CDMA, frequency hopping, OFDM or TDMA access technologies.

The instant disclosure is provided to further explain in an enabling fashion the best modes of performing one or more embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions.

Much of the inventive functionality and many of the inventive principles when implemented, are best supported with or in integrated circuits (ICs) including, for example, application specific ICs, or a digital signal processors or general purpose processors and software therefore or combinations of each. It is expected that one of ordinary skill, notwithstanding possibly significant effort and many design choices motivated by, for example, available time, current technology, and economic considerations, when guided by the concepts and principles disclosed herein will be readily capable of generating such ICs or software instructions with minimal experimentation. Therefore, in the interest of brevity and minimization of any risk of obscuring the principles and concepts according to the present invention, further discussion of such ICs and software, if any, will be limited to the essentials with respect to the principles and concepts used by the preferred embodiments.

Referring to FIG. 1, an exemplary and representative environment or system diagram with constituent equipment that is suitable for advantageously using switching power amplifiers will be discussed and described. The diagram of FIG. 1 generally shows a mobile station or communication unit 101, such as a cellular handset or personal digital assistant or the like that is communicating, via the communication link 102 with fixed equipment such as a base station 105 and thus a network 107, such as a public switched telephone system or public switched data system. Note that the communication link 102 is depicted generally as an air interface but can be either a wired or wireless link. Furthermore the communication link can be between two mobile stations or two fixed equipment units, e.g. base stations or a distribution amplifier and set top box in, for example, a cable TV system. Also it will be appreciated that other entities or functions that are part of typical systems are not specifically shown but will be understood by one of ordinary skill to be present and operational.

Figure 2:
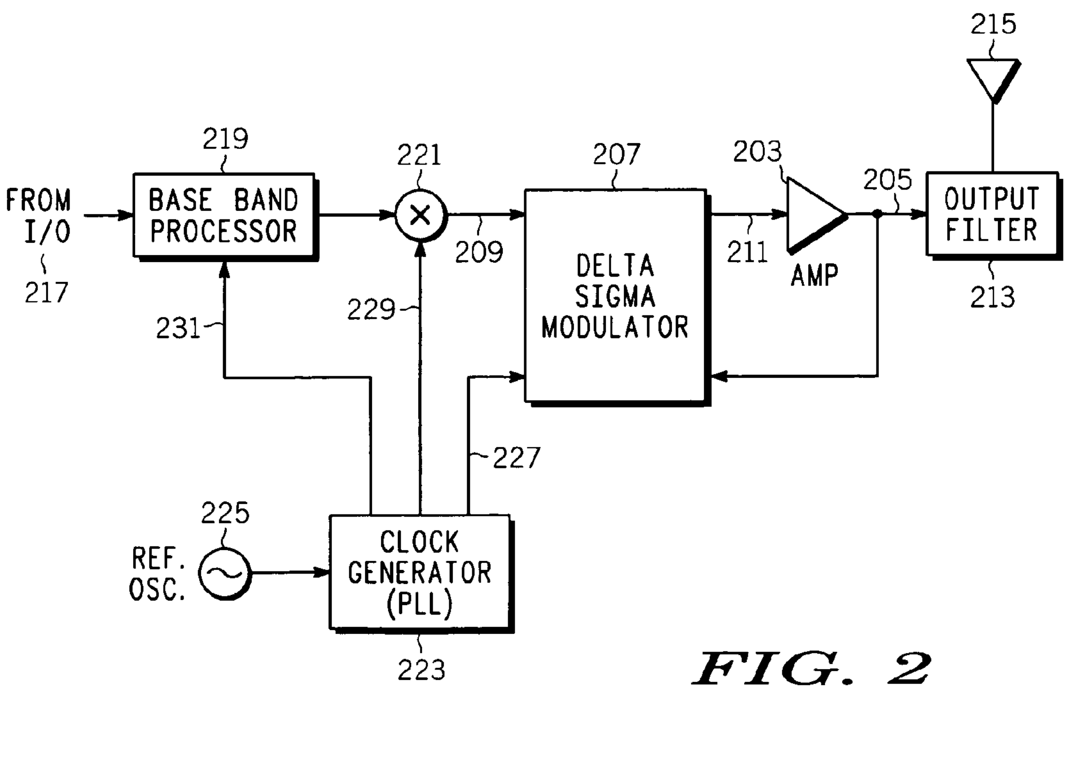
FIG. 2 depicts a block diagram of a switching power amplifier using a frequency translating delta sigma modulator.

Referring to FIG. 2, a simplified block diagram of a switching power amplifier using a frequency translating delta sigma modulator, such as or similar to the power amplifiers within the equipment or units of FIG. 1, e.g. the communication or wireless communication unit 101 or base or wireless base station 105 will be discussed and reviewed. FIG. 2 shows a radio frequency (RF) switching power amplifier comprising an amplifier 203, such as a switching amplifier that is operable to provide an amplified signal at an output 205, where the amplified signal is within an RF band of interest, for example a frequency band around 2.1 GHz. The RF switching amplifier further includes a delta signal modulator (DSM) 207 that is operable to control the switching amplifier in a feedback configuration (amplified signal is fed back to the DSM as shown). The DSM is further operable to process an input signal, where the input signal is within an intermediate frequency (IF) band, such as a frequency band around 100 MHz. The input signal corresponds to a base band signal that typically has been up converted in frequency to the IF band and is provided at the input 209 and further corresponds to the amplified signal as fed back and down converted to the IF band as will be discussed further below. The DSM thus and further provides an output signal or encoded signal at an output 211. The output signal is within the RF band and is suitable to drive the switching amplifier 203. Thus, the DSM is operable to process the input signal and translate the frequency of that signal from an IF frequency in the IF band to an RF frequency in the RF band.

The switching amplifier 203 can be any one or perhaps combination of a class S amplifier, a class D amplifier, a class E amplifier, a class F amplifier, and the like, where these and other suitable classes of switching amplifiers are generally known in the field. For example, a known "totem pole" or series coupled arrangement of switching devices where one such device is coupled from a power supply to the output 205 and a second device is coupled from the output 205 to a common or ground potential with only one of the two devices "on" or conducting at any one instant in time can be used. Note that the switching amplifier can include multiple stages that are series coupled to obtain the proper gain, multiple stages that are parallel coupled pursuant to the same objective, or some combination of each, e.g. a driver stage coupled to and driving multiple parallel coupled output stages. Furthermore it may be appropriate to have some form of power control over the switching amplifier or specifically output power from the amplifier, such as a controllably variable voltage power supply or arrangement for enabling more or fewer parallel coupled output stages as will be appreciated by those of ordinary skill.

In any event the switching amplifier 203 is coupled to an output filter 213 that is preferably a band pass filter with sufficient selectivity and Q to reject any harmonics or other components of the amplified signal that are outside the radio frequency band of interest. Typically higher Q suggests lower insertion loss for a given selectivity. The degree of selectivity or rejection of undesirable signals will depend on the expected magnitude of such signals (harmonics or other components) at the output 205, their respective and relative location in frequency as well as the desired level of such signals relative to the desired signal at the output of the output filter 213. The levels of the desired and undesired signals are ordinarily mandated by the competent authority, for example the Federal Communications Commission for the United States. The output filter 213 or output signal from the filter is then coupled to a load, such as the antenna 215, a wave guide input, or coaxial port, dependent on the particulars of the application. For a wideband CDMA system with a 20 MHz bandwidth transmitted signal near 2.1 GHz using an IF frequency at or near 100 MHz an output filter with a pass band from 2.11 GHz to 2.13 GHz, 30 dB of rejection at 2.1 GHz and 2.14 GHz and in excess of 100 dB of rejection at 1.99 and 1.96 GHz as well as 2.25 and 2.28 GHz has been found to be satisfactory. Such filters can be implemented in various technologies, such as cavity, stripline, micro-strip thin-film ceramic LC filters or some combination of one or more of these technologies. It may be desirable to implement all or a portion of the output filter in an integrated form with the amplifier 203.

The delta sigma modulator 207 is provided with one or more clock signals or frequency references at input 227. This clock signal can be generated with a phase locked loop (PLL) 223 or the like as will be appreciated by one of ordinary skill. The PLL 223 is referenced to a reference oscillator 225 that can be a high stability, such as 2 ppm or 5 ppm crystal based oscillator. Depending on the stability requirements of an application, for example a base station, the reference oscillator can be an environmentally controlled oscillator (for example in a preheated enclosure) and the like for even better frequency stability, e.g. less than 0.5 ppm. The PLL 223 may also provide additional reference frequencies or clocks, such as the clock at 231 and 229, for use by, respectively, a base band processor 219 and an up converter 221 or mixer.

The base band processor 219 operates to process incoming information or data from some input output function 217, such as an audio or data source/sink, and provide a base band signal to the up converter 221. The particulars of the data and base band processing are not relevant to the present application other than to note that they will vary according to the requirements of the particular technologies or standards and corresponding application (mobile or base station for example) that are being implemented and practiced. For example, for code division multiplex access (CDMA) systems this processing may include voice encoding, inner and outer channel coding, signal spreading with long and short codes, I and Q (in phase and quadrature) modulation, channel filtering, and so forth. As one example, the output of the base band processor and thus input of the up converter 221 in a wideband CDMA system is a base band signal that occupies a frequency band from approximately 0–20 MHz. The up converter 221 is a mixer that converts the base band signal at the input to a signal in the IF band or at the IF frequency corresponding to the base band signal at a frequency corresponding to the clock frequency or rate at 229. Thus in our 20 MHz CDMA example if the clock rate is 100 MHZ the signal at 209 would correspond to the base band signal and occupy a frequency band from 80–120 MHz, given the dual sided nature of a signals spectral content. Note that the up converter 221 may also perform I and Q modulation as well as frequency conversion in a known manner.

Figure 3:
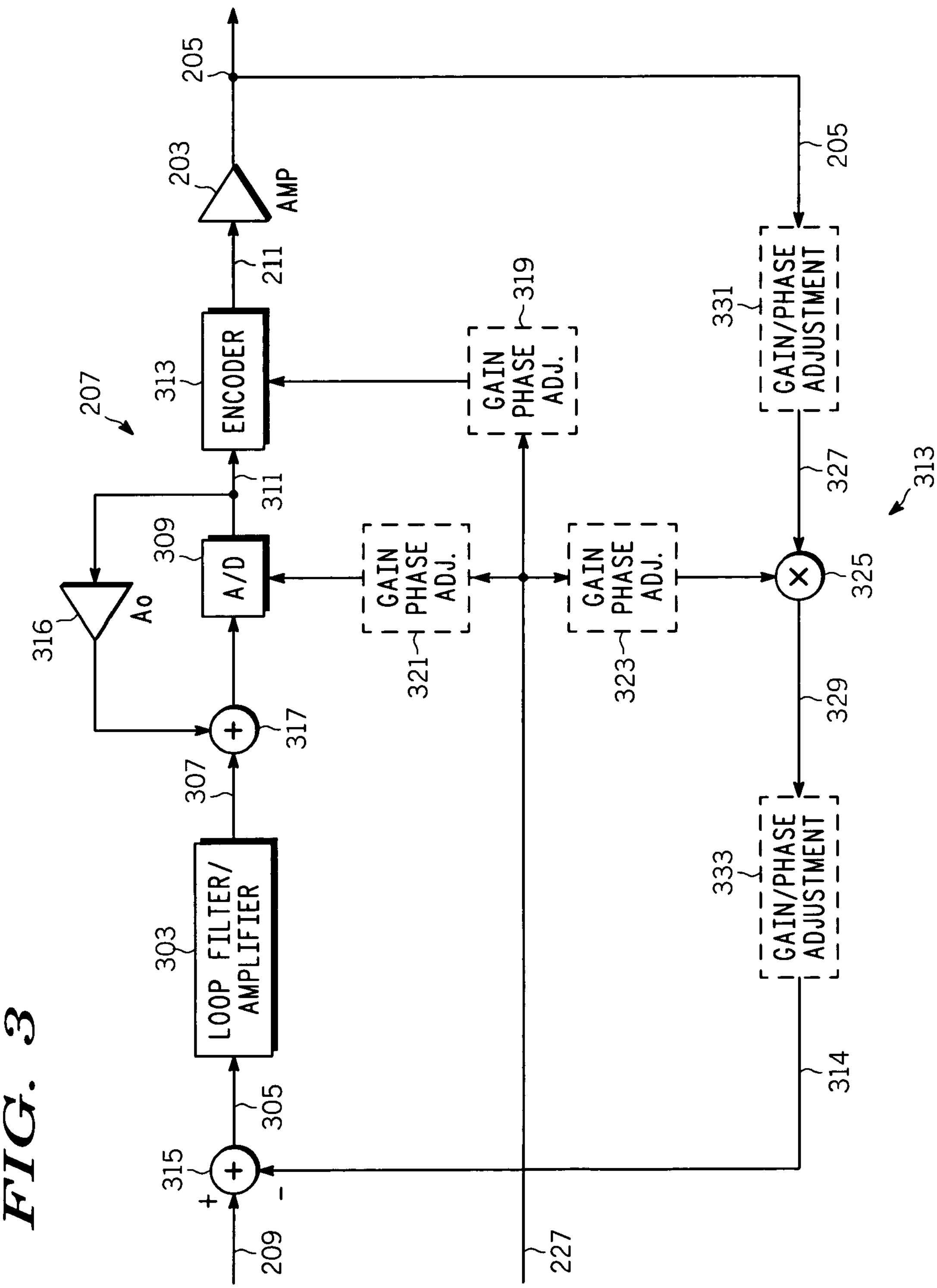
FIG. 3 depicts a more detailed block diagram of the delta sigma modulator of FIG. 2.

Referring to FIG. 3, a more detailed diagram of the switching power amplifier, specifically delta sigma modulator (DSM) 207, of FIG. 2 will be discussed and described. In FIG. 3, like reference numerals refer to like or analogous elements from FIG. 2 and thus will not be dwelled upon. Generally FIG. 3 depicts the DSM 207 arranged and configured to provide a signal or encoded signal at 211 suitable for driving the amplifier 203. The amplifier or switching amplifier 203 provides the amplified signal at 205 and this signal is fed back to the DSM, e.g. a feed back processor 313 in order to complete a feedback or control loop arrangement.

The DSM 207 further comprises an amplifier or loop filter 303 that has a frequency selective response and is operable to amplify and filter an input signal at 305 that is at an intermediate frequency or within an IF band to thus provide an output signal at 307. Note that the output signal is normally a continuously variable or analog signal. The frequency selective response is chosen, for example, as a frequency response that passes the signals of interest, e.g. the signals over which it is desired for the feedback or control loop to exercise control or determine characteristics. In one embodiment this a band pass filter as will be further reviewed below with reference to FIG. 4.

The output signal at 307 is coupled to an analog to digital converter (ADC) 309 that is included in the DSM 207. The ADC is configured and operable to provide a discrete or digital output signal at 311. In certain embodiments this discrete output signal is a bi-level or binary signal and the ADC 309 is essentially a comparator that is clocked at the clock rate at 227 and that provides a high or one output when the signal from the amplifier/filter at 307 exceeds or satisfies a threshold, such as the mean of the input signal to the ADC and a low or zero signal when the threshold is not exceeded or satisfied. In other embodiments the ADC can be a multi-bit converter (e.g. input signal quantized into a multi-bit representation) or a multi-level converter where the input signal is quantized into one of several discrete levels. Thus the ADC can be a 1-bit ADC or a multi-bit ADC. A compensation circuit 316 is coupled from an output to an input of the ADC. The compensation circuit is arranged to combine at summer 317 a portion of the discrete output signal at 311 as determined by $A_0$, with the output signal at 309 to provide a resultant signal at the input of the ADC and this resultant signal is digitized or converted.

The discrete or digital output signal at 311 is coupled to an encoder 313 that is also included in the DSM 207. The encoder 313 is configured and operable to provide an encoded signal at 211 where the encoded signal is within an RF band or at a radio frequency (RF). Thus the encoder is operable to convert or translate a signal at an IF frequency to a signal at the RF frequency where the signal at the RF frequency can be used to drive the amplifier 203. In one embodiment the encoder is a Manchester encoder as will be further discussed below with reference to FIG. 4. The encoder encodes the ADC decisions, e.g. digital signal or discrete output signal at 311, into a continuous-time waveform with predetermined levels that depend on the input digital signal, where this encoding occurs at the clock rate at 227.

Various types of encoders or encoding can be employed to provide the frequency conversion or translation. Many of these encoders can be classified, for example, into nonreturn-to-zero (NRZ) encoders, return-to-zero (RZ) encoders, phase encoded encoders, and multilevel binary encoders. A discussion of various forms of encoders, such as NRZ-level, mark, and space encoders, RZ (unipolar, bipolar, and alternate mark inversion (AMI)) encoders, phase encoders (bi-phase level also known as Manchester, mark, space, and delay modulation also known as Miller), and multi-level binary (dicode NRZ, dicode RZ, Bipolar RZ, and RZ-AMI) encoding can be found in Chapter 2, section 2.8 of Sklar, DIGITAL COMMUNICATIONS FUNDAMENTALS AND APPLICATIONS; Prentice Hall, 1988 (Sklar). This Sklar material is hereby incorporated herein in its entirety by reference. In particular, FIG. 2.22 of Sklar shows diagrams that are useful in appreciating the operational characteristics of various forms of encoders.

The feedback processor 313 is operable to provide a feedback signal at 314 that corresponds to the amplified signal and that has been converted from the RF band or radio frequency to the IF band or intermediate frequency. The feedback signal is combined at summer 315 with a base band signal, e.g. signal at an IF frequency that corresponds to the base band signal as noted above, to provide the input signal for the amplifier/filter 303. Note that the input signal for the amplifier 303 is really an error signal for the control loop or feedback arrangement that is used by the DSM in order to compensate for differences between the signal at 209 and the amplified signal at 205. The feedback processor 313 further comprises a mixer 325, that in some embodiments is a chopping mixer, for converting a mixer input signal at 327 which is at the radio frequency and corresponds to the amplified signal at 205 to a mixer output signal at 209 where the mixer output signal is at the intermediate frequency. A chopping mixer is a mixer that multiplies the analog input by +1 or −1 depending on whether the clock input is "high" or "low". It can be implemented by using the clock input to select between a true or an inverted version of the analog input signal. A chopping mixer has the advantage that it will frequency translate a broad bandwidth of signal which may be required for the DSM feedback path. The mixer 325 down converts the mixer input signal according to the clock rate at 227. The feedback processor 313 can further include a feedback compensator or compensation circuitry 331, 333 for adjusting a gain, a phase, or time delay of the feedback signal at 314.

Thus the feedback processor is operable to convert an input signal corresponding to the amplified signal to a feedback signal within the IF band. The feedback processor can include a chopping mixer clocked at a rate to convert an input frequency within the RF band to an output frequency within the IF band. The feedback compensator, if used or needed, is for adjusting a gain, a phase, or a time delay of the feedback signal. This compensation can be adjusted as needed to insure that the control loop remains stable under relevant conditions. The compensation circuit 316 further insures stability by providing for as much as a one clock cycle delay from the input to the encoder 313 through the amplifier 203 and the mixer 325. Additionally the clock signal at 227 can be adjusted (gain, phase, time delay) for the ADC 321, encoder 313, and mixer 323 by the gain/phase adjustment functions 321, 319, 323, respectively. Note that the phase adjustment functions may or may not be required or possibly only some of them will be needed. This will depend on the specifics of delays through various portions of the delta sigma modulator or overall amplifier.

Figure 4:
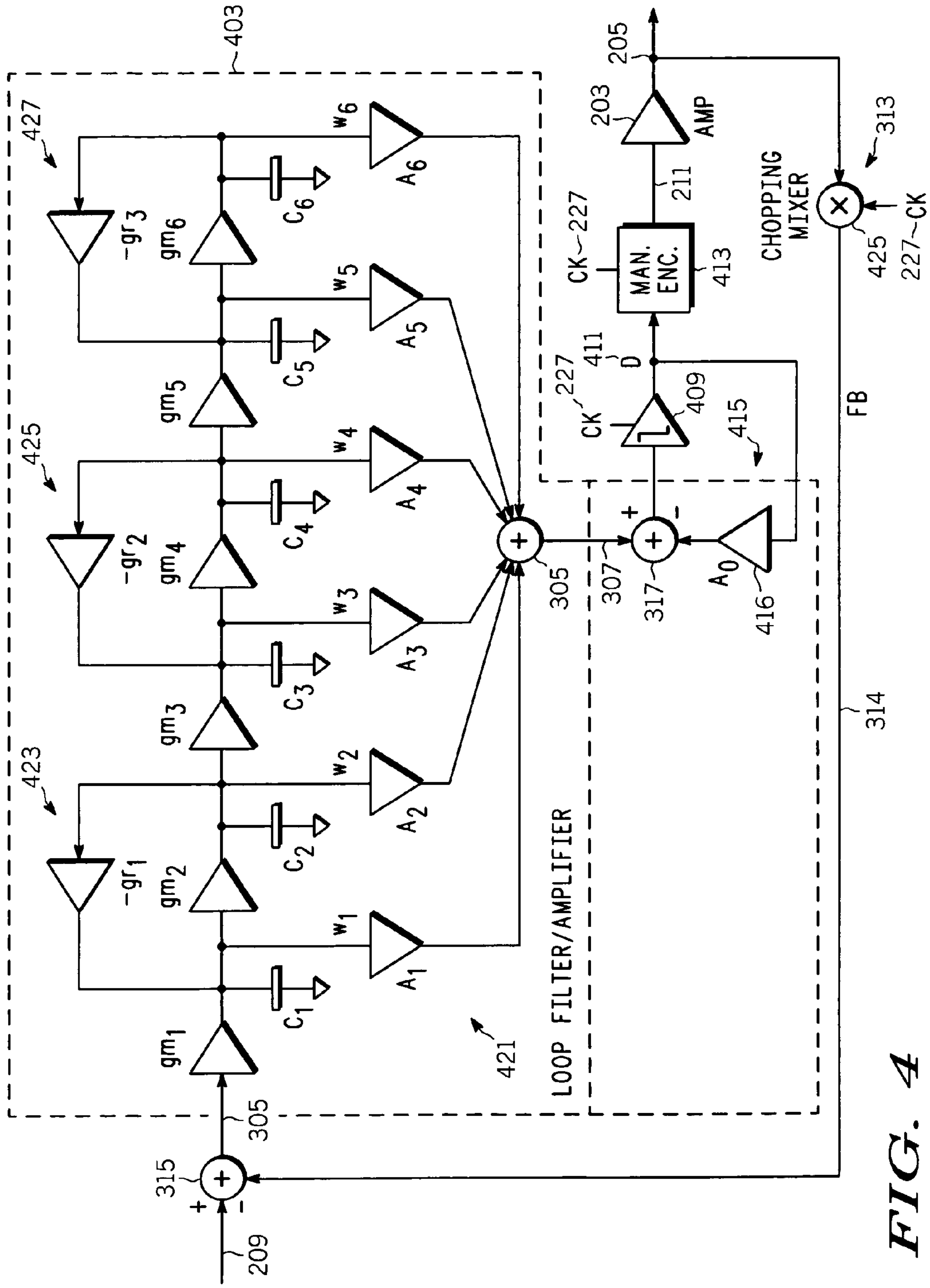
FIG. 4 depicts a more detailed block diagram of one embodiment of the FIG. 3 delta sigma modulator.

Referring to FIG. 4, a more detailed diagram of one embodiment of the FIG. 3 switching power amplifier and specifically an embodiment of the delta sigma modulator will be discussed and described. In FIG. 4, like reference numerals refer to like or analogous elements from FIG. 3 and thus will not be dwelled upon. In this embodiment, the input or signal corresponding to a base band signal for the DSM at 209 comes in at an IF frequency as noted above and a feedback signal (FB) at 314 is subtracted from the input by the summer 315. The feedback signal is provided by the feedback processor 313, specifically chopping mixer 425 where the chopping mixer is clocked at the clock rate of the clock signal 227.

The difference is an error signal or input signal at 305 that is filtered, amplified, or otherwise processed by a loop filter or amplifier 403 having a frequency selective response, for example, a band pass frequency response, and otherwise configured to provide an output or processed signal at 307. This signal or signal corresponding thereto is coupled to an ADC 409, for example in this embodiment a comparator or 1-bit ADC that is clocked with the clock signal at 227 and provides a discrete or digital output signal (D) at 411.

The digital output signal D or portion thereof determined by $A_0$, is coupled by a compensation circuit 415 back to the input of the ADC. Specifically, the digital output signal as modified by amplifier 416 with gain $A_0$, is coupled to the summer 317 and subtracted from the output signal provided by the loop filter at 307 with the resultant signal coupled to the ADC. The $A_0$ coefficient is selected to support a full clock cycle propagation delay from node D 411 to node FB 314 thereby allowing for the delay in the amplifier 203 and associated circuitry. Note that one or more of the gain/phase adjustment functions discussed above may also need to be utilized. These have not been shown for the sake of simplicity in the illustration.

The discrete or digital signal D 411 is coupled to an encoder, in this embodiment, a Manchester encoder 413. The Manchester encoder 413 is coupled to a clock signal 227 and operable to provide the encoded signal, where the encoded signal includes an output transition corresponding to a state of the discrete output signal for each cycle of the clock signal. The Manchester encoder is clocked at a rate of the radio frequency minus the intermediate frequency or the radio frequency plus the intermediate frequency. The encoder is operable to convert an IF signal within the IF band that corresponds to the input signal to an RF signal within the RF band that corresponds to the output signal or encoded signal. The encoder thus generates or provides an output signal or the encoded signal at or within a radio frequency band at 211 for driving the amplifier 203 to provide the amplified signal 205. Manchester Encoding can be viewed as performing modulation to translate the IF signal or frequencies to the corresponding RF signal or frequencies.

The loop filter or amplifier 403 in certain embodiments is a transconductance-capacitor (gmC) filter 421 having a band pass response. The gmC filter can further comprise a plurality of stages of gmC filtering 423, 425, 427, as shown. The gmC filtering comprises a plurality of cascading stages of gm/C integrators with local feedback as depicted that form resonators as generally known. The resonance frequency of the resonators is set to the IF frequency in order to amplify the IF band portion of the error or input signal and attenuate portions of the input signal outside of the IF frequency band. The loop filter output at 307 is a weighted sum of the integrator states where the weighting is done by the amplifiers A1, A2, A3 . . . and the summing is accomplished with the summer 405. Note that other filter topologies, such as a MOSFET-capacitance filters, and a transconductance-opamp-capacitance filters can alternatively be utilized where these filter topologies are generally known.

The loop filter or amplifier in one version of the FIG. 4 embodiment has a nominal center frequency of one of 61 MHz, 92 MHz, or 123 MHz and bandwidth in excess of 20 MHz with 6 poles and 6 zeros. The clock frequency that clocks the ADC is 2.23 GHz. Thus configured, the loop filter will pass a 20 MHz bandwidth signal within the IF band. The degree of noise rejection or resultant signal to noise within and adjacent to the IF band will be a function of the IF signal bandwidth, the loop filter characteristics and the switching or clocking frequency of the DSM (ADC). Generally for a given band width of the loop filter and desired signal greater noise rejection can be achieved with a higher clocking frequency.

Figure 5:
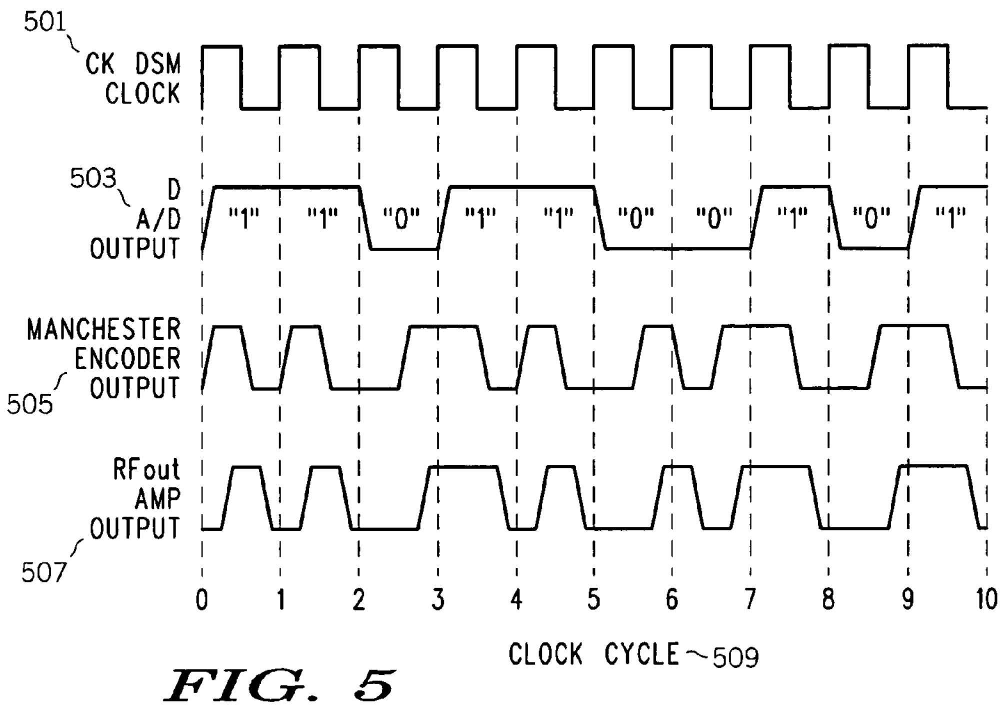
FIG. 5 illustrates a signal diagram that shows the relationship between various signals in the diagram of FIG. 4.

Referring to FIG. 5, an illustration or signal/timing diagram that shows the relationship between various signals in the diagram of FIG. 4 will be discussed and described. FIG. 5 shows a clock signal 501, an exemplary ADC output or discrete output signal (D) 503, a Manchester encoder output signal 505 given the clock signal and ADC output signal 503, and an amplified signal 507, such as the signal at 205, each as a function of clock cycle 509 that varies from cycle 1 to cycle 10. FIG. 5 illustrates the Manchester encoding process in greater detail. On each cycle of the DSM clock 501, the comparator makes a “1” or “0” decision, see 503. The Manchester Encoder encodes the comparator decisions into a continuous-time waveform or encoder output 505 with either the first half of the cycle as “high” (if D is “1”) or the second half of the cycle as “high” (if D is “0”). This encoding process has the effect of frequency translating signals at the IF frequency to the RF frequency. The PA output or amplified signal 507 is an amplified and phase delayed version of the Manchester Encoder output waveform.

There are several advantageous principles and concepts associated with the above described and discussed architecture over previously known practices. For example, the amplifier or switching amplifier 203 is inside the DSM controlled loop or feedback loop. This results in the amplifier (switching power amplifier) imperfections being suppressed by the loop gain. By designing the loop gain to be very large or as large as possible given stability issues (loop gain and phase shift versus frequency) over the band of interest these imperfections can be suppressed to a corresponding arbitrary degree. This is a tremendous advantage in not only relaxing the switching amplifier design objectives and requirements but also allows the power amplifier to be optimized for power efficiency.

Another significant advantage is the DSM loop filter or amplifier 303, 403, etc. will process signals at the IF frequency (for example, 92 MHz for an RF output at 2.1 GHz). This is in stark contrast to other schemes that clock this filter or amplifier and other DSM elements at 4 or more times the RF frequency. The much lower IF frequency can significantly reduce the circuit requirements for the loop filter/amplifier. For example, the loop filter/amplifier can be implemented at the lower frequencies using for example gmC filters and thus without using inductors that are often physically large and low-Q (high loss). Furthermore, any tuning problem associated with these filters is dramatically relaxed by more than an order of magnitude since a percentage error in the tuning of an IF frequency on the order of 100 MHz is a much smaller error in Hz than that percentage error at, for example, a 2.1 GHz RF frequency.

Yet another advantage is the clocking rate for the DSM or constituent elements. With the new architecture, the DSM is only required to be clocked at more than twice the IF frequency (not twice the RF frequency) to meet the Nyquist sampling criteria. Given other considerations, such as in band noise and undesired signal suppression, one embodiment of the DSM is clocked at 2.23 GHz and the encoder and thus switching amplifier is clocked at 2.23 GHz. The encoder or switching amplifier or PA may be clocked at 2 times 2.23 GHz or 4.46 GHz thus avoiding some encoder complications associated with the mid cycle transition (see FIG. 5). This is substantially lower than the 4 xfc=8.2 GHz and 8 xfc=16.8 GHz that have been discussed in prior architectures. This advantage translates into greatly reduced circuit implementation requirements or complexities. Furthermore, the lower DSM clocking rate further relaxes DSM stability issues and saves power consumption.

Furthermore the enhanced stability control of the compensation circuit 316, 415 with the $A_0$ coefficient or feedback path around the ADC 309, 409 provides for an almost full clock cycle delay in the switching PA. As will be appreciated this further reduces the practicalities associated with the implementation of the amplifier or PA. This additional feedback path or compensation circuit allows for a large delay in the PA circuitry without compromising loop stability. This is important because at the RF frequencies of 2 GHz, it is tremendously difficult and expensive to reduce the delay or latency of the PA. Without the additional feedback path, the PA delay may make it difficult or impractical to include the PA inside the DSM control loop. If the PA is not inside the control or feedback loop, the feedback signal will have to originate at the input of the PA. In that case, the DSM control loop will not be able to suppress imperfections or non-linearity's of the PA. With the additional feedback path, PA delays of up to a full DSM clock period can be included inside the DSM loop and the tremendous noise suppression capability of the DSM can be applied to also suppress PA imperfections.

Figure 6:
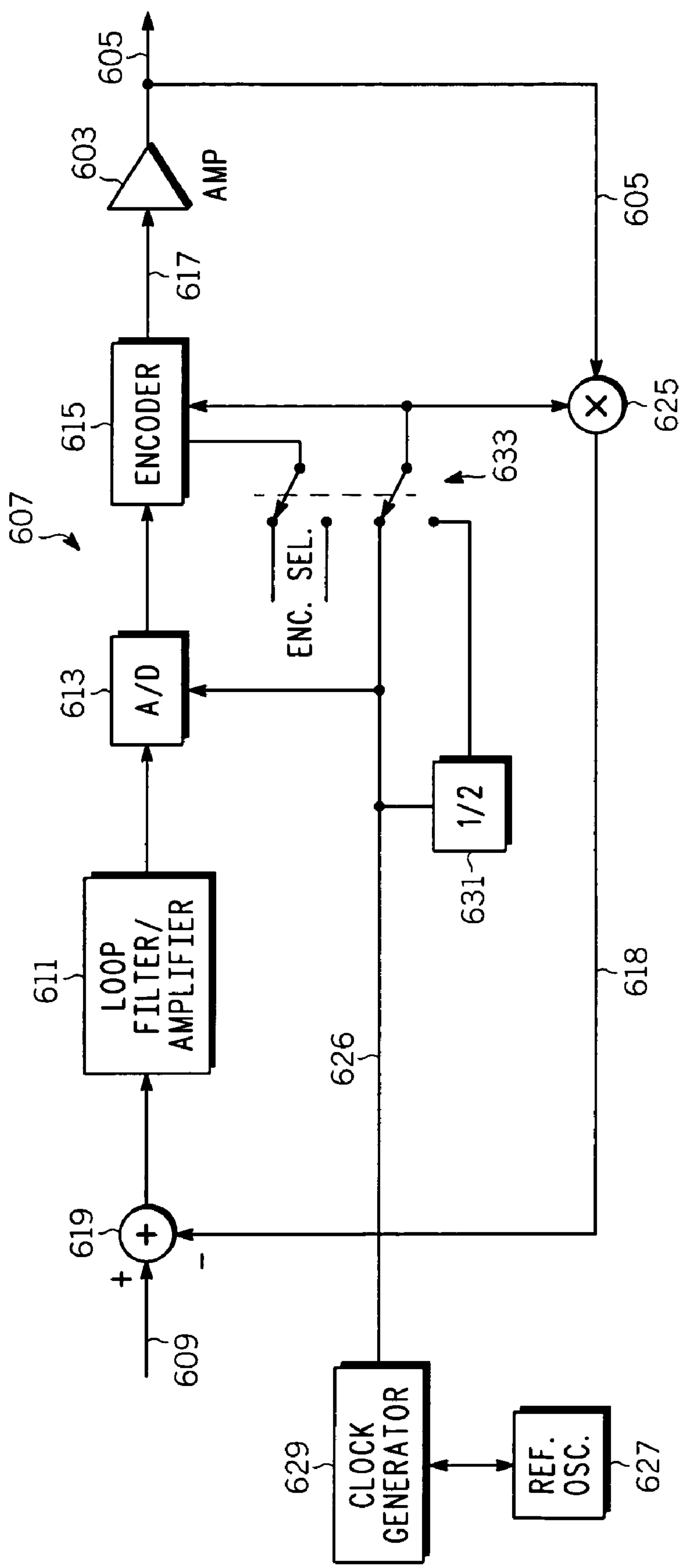
FIG. 6 depicts a block diagram of an alternative embodiment of a switching power amplifier with a delta sigma modulator.

Referring to FIG. 6, a block diagram of another embodiment of a switching power amplifier with a delta sigma modulator will be discussed and described. The diagram of FIG. 6 can be used to review and discuss a technique for using a floating intermediate frequency as well as a switching power amplifier with a delta sigma modulator suitable for multiple transmit frequency bands. The general architecture of the FIG. 6 switching power amplifier is similar to the above discussed architecture, see for example FIG. 2 and 3. Note that for simplicity of illustration, the various compensation functions have not been depicted but are understood to be present as may be required for a particular implementation. Many of the elements of FIG. 6 operate and function in an analogous manner to those discussed above with reference to the related FIG. 2 and 3, however they have been given new reference numbers, since they can vary somewhat. A brief review will be provided.

FIG. 6 shows a radio frequency (RF) switching power amplifier that comprises a switching amplifier 603 operable to provide an amplified signal at 605 within an RF band, for example the 2.1 GHz RF band associated with certain cellular services and a delta signal modulator (DSM) 607 operable; to control the switching amplifier in a feedback configuration (via mixer or chopping mixer 625 and feedback signal 618), to process an input signal (output of summer 619) within an intermediate frequency (IF) band, the input signal corresponding to a base band signal (base band signal converted to the IF band and available at 609) and the amplified signal 605 (converted to the IF band by mixer 625), and to provide an output signal at 617 within the RF band to drive the switching amplifier 603.

The DSM 607 includes the loop filter/amplifier 611 generally configured and operating as noted above with an output coupled to an ADC 613 that also operates as earlier discussed. The output of the ADC 613 is coupled to an encoder 615 that is configured and operable to convert or encode the output of the loop filter after conversion to a digital signal by the ADC, e.g. an IF signal within the IF band that corresponds to the input signal to the loop filter, into an RF signal within the RF band that corresponds to the output signal from the encoder at 617. This RF signal is used to drive the switching amplifier 603. In one embodiment this encoder performs Manchester encoding.

The encoder is coupled to the clock signal at 626 (for example directly or by the switch 633 if present). The ADC is also coupled to and clocked by or according to the clock signal at 626. In some embodiments it may be beneficial to clock the encoder at twice the rate that the ADC is clocked. If so, a divide by 2 stage or circuit can be inserted in the clock line going to the ADC and the ADC will still be clocked according to the clock signal. Doing this, as is known, may allow a more elegant Manchester encoder implementation since a negative clock edge will not need to be used by the encoder for the mid cycle transitions (see FIG. 5).

The radio frequency switching power amplifier further comprises a clock generator 629 that is configured and operable to provide the clock signal at 626 at a clock rate to adjust the radio frequency to a desired radio frequency as will be discussed in more detail below. The clock generator is coupled to or referenced to a reference oscillator 627 with a frequency that varies with the frequency selective response of the amplifier/loop filter 611, given production tolerances and drift mechanisms.

This inventive and advantageous approach, e.g. using a floating IF frequency, can be used to account for variations and drift in the IF frequency of the loop filter/amplifier 611, whereas a conventional approach would be to tune the loop filter circuitry to a fixed IF frequency. However, circuitry for tuning the loop filter adds delays and nonlinearities that can be extremely challenging in designs for high performance applications. The inventive approach uses a variable IF frequency and adjusts the clock rate or frequency at 625 so that the frequency translation from the IF band or frequency to the RF band or frequencies results in an RF output from the encoder at the desired fixed or known and predetermined RF frequency.

The reference oscillator generates a signal with the same frequency variations as the IF frequency of the loop filter. Because of manufacturing tolerance and drift mechanisms the IF frequency will vary from one DSM to another as well as over time and with other environmental variables such as temperature. However, because the reference oscillator can be constructed of components that match the components in the loop filter (for example, via semiconductor fabrication techniques as is known), the variations in the reference oscillator frequency will accurately track the variations in the loop filter IF frequency. The clock generator uses the reference oscillator output and 1) generates the proper local oscillator frequency to up convert the input signal to the IF frequency (not specifically shown in FIG. 6 but see FIG. 2 at 231 for example), and 2) generates the clock signal at 626 so that the Encoder will translate the IF to the specified RF frequency.

The relationship between the DSM clock and the IF frequency is $$f_S=f_{RF}+f_{IF}$$

where $f_S$ is the clock signal, $f_{RF}$ is the RF output frequency and $f_{IF}$ is the IF frequency. Thus the frequency of the signal at 609 will match the IF frequency of the loop filter and any variations in the IF frequency will be tracked out by corresponding variations in the clock signal. Without the burden of fine tuning circuitry, the loop filter circuit can be optimized for speed, noise, and linearity performance. Note that this alternative approach to the tuning problem is only possible with a frequency translating DSM. The described embodiment comprises a frequency translating DSM with a variable or floating IF frequency and an Encoder that frequency translates from the IF band to the RF band, a reference oscillator that outputs a signal relating to the variable IF frequency, a clock generator supplying the clock signal having a variable output clock rate or frequency that varies in accordance with the reference oscillator output signal such that the Encoder will translate the IF band or signal to a specific RF band or frequency.

The radio frequency switching power amplifier of FIG. 6 can also be arranged and configured to operate in different radio frequency bands, such as 900 MHz and 2.1 GHz or others. FIG. 6 depicts one embodiment for implementing a multi band switching power amplifier for radio frequencies. In FIG. 6, the encoder is operable to provide the encoded signal at 617 at either a first radio frequency in a first transmit frequency band or a second radio frequency in a second transmit frequency band. The switch 633 operates to select between different encoders as well as different clock signals or different rates or frequencies. The encoder can be coupled to the clock signal at 626 or the output of a divide by 2 stage or circuit 631. Thus the encoder is clocked at a first clock rate to provide the encoded signal at the first radio frequency and at a second clock rate to provide the encoded signal at the second radio frequency in this embodiment. Furthermore, for example, the encoder performs Manchester encoding to provide the encoded signal at the first radio frequency and chopped nonreturn-to-zero encoding to provide the encoded signal at the second radio frequency. The second clock rate and the first clock rate vary by a factor approaching two given the divide by 2 stage. For a particular two RF bands, such as 2.1 GHz and 900 MHz some minor adjustment would be required in the output rate or frequency of the clock generator in order to get specific frequencies within these bands and thus the two rates will be related by a factor approaching two, rather than necessarily equal to two. Thus the encoder is operable to convert the IF signal to one of a first RF signal within a first RF transmit band and a second RF signal within a second RF transmit band.

Figure 7:
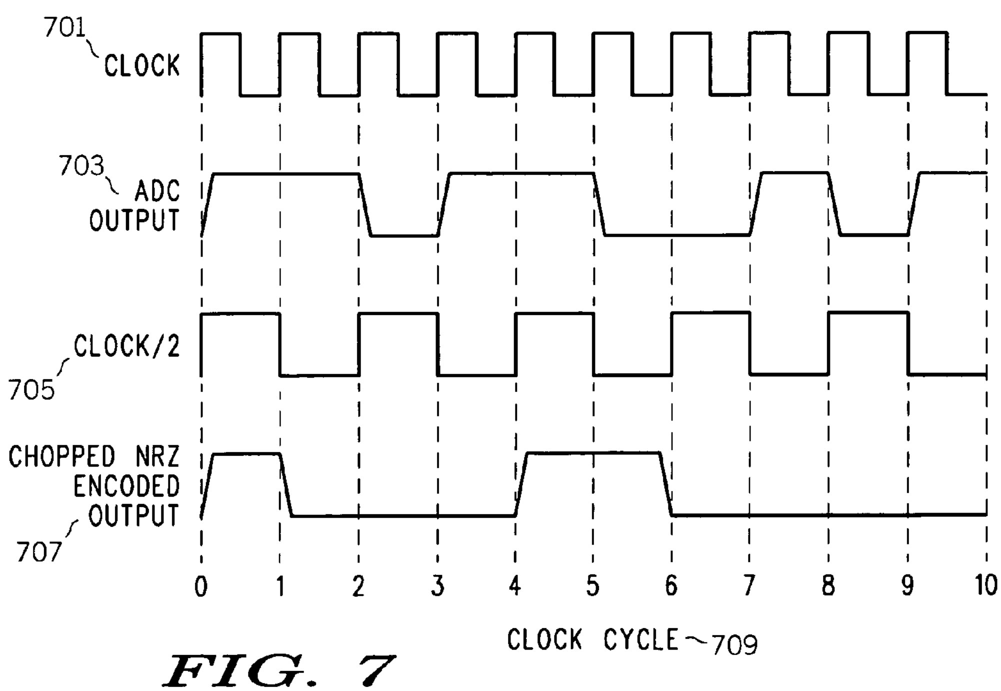
FIG. 7 illustrates another signal diagram that shows the relationship between various signals in the diagram of FIG. 6.

FIG. 7 shows some exemplary waveforms that will be used to explain the Chopped NRZ encoding. FIG. 7 is a timing diagram that illustrates the concept and enables the chopped NRZ encoder. Waveforms are shown for the clock signal 701, an exemplary ADC output 703, the clock signal divided by two 705, and the chopped NRZ encoder output as a function of clock cycles 709. At each clock cycle, the ADC or comparator decides whether to provide a high ("1") or low ("−1") dependent on the input to the ADC. The encoder simply multiplies the "1" and "−1" outputs of the comparator by the "1" and "−1" of the clock divided by two thereby inverting every other bit or output from the ADC. The encoded output 707 is sent to the switching amplifier 603 for amplification. The output of the amplifier is fed back through the chopping mixer 625 which essentially demodulates the Chopped NRZ Encoding and recovers the ADC output bit stream. Thus, for example if the signal at 609 is 160 MHz it can be modulated by 1.08 GHz (2.16 GHZ clock divided by two) to produce an encoder output at 617 at 920 MHz, whereas for a 160 MHZ signal at 609 and a clock signal of 2×1.08 GHz=2.16 GHz the encoder output will be 2.0 GHz.

It has been experimentally confirmed that the Chopped NRZ Encoding process mixes the ADC output by the clock divided by two and produces an output spectrum as noted above. The IF band signal at the output of the ADC is modulated by fs/2 to yield a signal at $((fs/2)-f_{IF})$. For fs=2.16 GHz, $f_{IF}$=160 MHz, the RF output is at 920 MHz. Simulation and MathCad calculations show that the encoded output power is at similar levels or slightly higher than in Manchester Encoding. Note that if fch=fs, then the above equations reduce to Manchester Encoding as noted above. In other words, Chopped NRZ Encoding and Manchester Encoding differ only in the rate of the chop clock.

Thus the switching power amplifier of FIG. 6 having multi band characteristics can be implemented by switching the encoder between Chopped NRZ and Manchester encoding modes. The Chopped NRZ mode is used for frequency bands near 900 MHz, and Manchester encoding is used near 2 GHz. Therefore, the MODE signal selects whether 2.16 GHz or 1.08 GHz is used for the encoder clock. The MODE signal is also used to instruct the encoder to select between Manchester Encoding or Chopped NRZ. As will be appreciated the multi-mode encoder is functionally quite simple to implement. Note that fs will need to be tuned to select the precise RF frequency band near 2 GHz or 900 MHz. Chopped NRZ Encoding shares many similarities with Manchester Encoding—in fact, they differ conceptually only in the rate of the encoder clock. Advantageously, a frequency translating DSM can be constructed that addresses both 2 GHz frequency bands and 900 MHz bands by switching between Chopped NRZ and Manchester Encoding modes.

Thus a radio frequency switching power amplifier using a delta sigma modulator that performs frequency translation and corresponding methods has been disclosed that facilitates the use of highly efficient switching amplifier technologies in high frequency complex modulation applications and yet allows for a practical implementation of the delta sigma modulator and switching amplifiers associated therewith. Using the principles and concepts described is expected to result in communication equipment that is smaller with lower power consumption and improved performance thereby providing for increased customer satisfaction since the associated costs (energy, size, weight, etc) of excess power consumption are avoided.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A radio frequency switching power amplifier comprising:

- an amplifier having a frequency selective response, the amplifier operable to amplify an input signal at an intermediate frequency to provide an output signal;
- an analogue to digital converter (ADC) coupled to the output signal and operable to provide a discrete output signal;
- an encoder coupled to the discrete output signal and operable to provide an encoded signal at a radio frequency;
- a switching amplifier coupled to the encoded signal and operable to provide an amplified signal; and
- a feedback processor operable to provide a feedback signal that corresponds to the amplified signal and that has been converted to the intermediate frequency, the feedback signal combined with a signal corresponding to a base band signal to provide the input signal for the amplifier.

2. The radio frequency switching power amplifier of claim 1 wherein the amplifier having a frequency selective response further comprises a transconductance-capacitor filter having a band pass response.

3. The radio frequency switching power amplifier of claim 2 wherein the transconductance-capacitor filter further comprises a plurality of stages of transconductance-capacitor filtering.

4. The radio frequency switching power amplifier of claim 1 wherein the ADC further comprises one of a 1 bit ADC and a multi-bit ADC.

5. The radio frequency switching power amplifier of claim 1 further comprising a compensation circuit coupled from an output to an input of the ADC and arranged to combine a portion of the discrete output signal with the output signal to provide a resultant signal at the input of the ADC.

6. The radio frequency switching power amplifier of claim 1 wherein the encoder further comprises a Manchester encoder coupled to a clock signal to provide the encoded signal, where the encoded signal includes an output transition corresponding to a state of the discrete output signal for each cycle of the clock signal.

7. The radio frequency switching power amplifier of claim 6 wherein the Manchester encoder is clocked at a rate comprising one of the radio frequency minus the intermediate frequency and the radio frequency plus the intermediate frequency.

8. The radio frequency switching power amplifier of claim 6 wherein the ADC is clocked according to the clock signal.

9. The radio frequency switching power amplifier of claim 8 further comprising a clock generator operable to provide the clock signal at a clock rate to adjust the radio frequency to a desired radio frequency.

10. The radio frequency switching power amplifier of claim 9 wherein the clock generator is coupled to a reference oscillator with a frequency that varies with the frequency selective response of the amplifier.

11. The radio frequency switching power amplifier of claim 1 wherein the switching amplifier comprises one of a class S, a class D, a class E, and a class F switching amplifier.

12. The radio frequency switching power amplifier of claim 1 wherein the feedback processor further comprises a chopping mixer for converting a mixer input signal at the radio frequency to a mixer output signal at the intermediate frequency.

13. The radio frequency switching power amplifier of claim 1 wherein the feedback processor further comprises compensation circuitry for adjusting one of a gain, a phase, and a time delay of the feedback signal.

14. The radio frequency switching power amplifier of claim 1 wherein the encoder is operable to provide the encoded signal at one of a first radio frequency in a first transmit frequency band and a second radio frequency in a second transmit frequency band.

15. The radio frequency switching power amplifier of claim 14 wherein the encoder is clocked at a first clock rate to provide the encoded signal at the first radio frequency and at a second clock rate to provide the encoded signal at the second radio frequency.

16. The radio frequency switching power amplifier of claim 15 wherein the encoder performs Manchester encoding to provide the encoded signal at the first radio frequency and chopped nonreturn-to-zero encoding to provide the encoded signal at the second radio frequency.

17. The radio frequency switching power amplifier of claim 15 wherein the second clock rate and the first clock rate vary by a factor approaching two.

18. The radio frequency switching power amplifier of claim 1 arranged and constructed for utilization in one of a wireless communication unit and a wireless base station.

19. A radio frequency (RF) switching power amplifier comprising:

- a switching amplifier operable to provide an amplified signal within an RF band; and
- a delta signal modulator (DSM) operable;
  - to control the switching amplifier in a feedback configuration,
  - to process an input signal within an intermediate frequency (IF) band, the input signal corresponding to a base band signal and the amplified signal, and to provide an output signal within the RF band to drive the switching amplifier.

20. The radio frequency switching power amplifier of claim 19 wherein the DSM further comprises an encoder operable to convert an IF signal within the IF band that corresponds to the input signal to an RF signal within the RF band that corresponds to the output signal.

21. The radio frequency switching power amplifier of claim 20 wherein the encoder is operable to convert the IF signal to one of a first RF signal within a first RF transmit band and a second RF signal within a second RF transmit band.

22. The radio frequency switching power amplifier of claim 21 wherein the encoder is clocked at a first clock rate to convert the IF signal to the first RF signal and at a second clock rate to convert the IF signal to the second RF signal.

23. The radio frequency switching power amplifier of claim 22 wherein the encoder performs Manchester encoding to convert the IF signal to the first RF signal and chopped nonreturn-to-zero encoding to convert the IF signal to the second RF signal.

24. The radio frequency switching power amplifier of claim 22 wherein the second clock rate and the first clock rate vary by a factor approaching two.

25. The radio frequency switching power amplifier of claim 20 wherein the encoder is one of a nonreturn-to-zero encoder, a return-to-zero encoder, a phase encoder and multilevel binary encoder.

26. The radio frequency switching power amplifier of claim 19 wherein the DSM further comprises a filter that has a band pass response and is operable to attenuate portions of the input signal outside of the intermediate frequency band.

27. The radio frequency switching power amplifier of claim 26 wherein the filter further comprises one of a transconductance-capacitor filter, a MOSFET-capacitance filter, and a transconductance-opamp-capacitance filter.

28. The radio frequency switching power amplifier of claim 19 wherein the DSM further comprises an analog to digital converter (ADC) operable to provide a discrete signal corresponding to a processed signal.

29. The radio frequency switching power amplifier of claim 28 wherein the ADC is one of a 1 bit ADC and a multi-bit ADC.

30. The radio frequency switching power amplifier of claim 28 wherein the DSM further comprises a compensation circuit coupled between an output and an input of the ADC.

31. The radio frequency switching power amplifier of claim 19 further comprising a feedback processor operable to convert an input signal corresponding to the amplified signal to a feedback signal within the IF band.

32. The radio frequency switching power amplifier of claim 31 wherein the feedback processor further comprises a chopping mixer clocked at a rate to convert an input frequency within the RF band to an output frequency within the IF band.

33. The radio frequency switching power amplifier of claim 32 wherein the feedback processor further comprises a feedback compensator for adjusting one of a gain and a phase of the feedback signal.

34. The radio frequency switching power amplifier of claim 19 wherein the DSM is implemented in an integrated circuit.

35. The radio frequency switching power amplifier of claim 19 arranged and constructed for deployment in one of a wireless communication unit and a wireless base station.

36. The radio frequency switching power amplifier of claim 19 wherein the DSM further comprises:

a filter coupled to the input signal and having a bandpass response;

an analog to digital converter (ADC) coupled to a filter output; and an encoder coupled to an ADC output for converting a signal within the IF band to the output signal.

37. The radio frequency switching power amplifier of claim 36 further comprising:

a chopping mixer coupled to the amplified signal to provide a feedback signal within the IF band.

38. The radio frequency switching power amplifier of claim 36 wherein the ADC and the encoder are coupled to and clocked according to a clock signal.

39. The radio frequency switching power amplifier of claim 38 further comprising a clock generator operable to provide the clock signal at a clock rate to adjust the radio frequency to a desired radio frequency.

40. The radio frequency switching power amplifier of claim 39 wherein the clock generator is coupled to a reference oscillator with a frequency that varies with variations in the intermediate frequency band.

* * * * *